United States Patent [19]

Iwamoto et al.

[11] Patent Number: 4,571,504
[45] Date of Patent: Feb. 18, 1986

[54] SCHMITT TRIGGER CIRCUIT WITH SELECTION CIRCUIT

[75] Inventors: Yoshihiro Iwamoto, Kawasaki; Tetsuya Iida, Yokohama, both of Japan

[73] Assignee: Tokyo Shibaura Denki Kabushiki Kaisha, Japan

[21] Appl. No.: 543,294

[22] Filed: Oct. 19, 1983

[30] Foreign Application Priority Data

Oct. 21, 1982 [JP] Japan .............................. 57-185110

[51] Int. Cl.⁴ ........................................... H03K 3/295
[52] U.S. Cl. .................... 307/290; 307/242; 307/279; 307/360; 307/451; 307/579
[58] Field of Search ............ 307/279, 288, 290, 443, 307/576, 579, 360, 243, 585, 242, 451-453

[56] References Cited

U.S. PATENT DOCUMENTS 3,851,189 11/1974 Moyer .................................. 307/279
3,904,888 9/1975 Griffin et al. ........................ 307/205
3,952,213 4/1976 Fukaya ................................ 307/265

FOREIGN PATENT DOCUMENTS 2522463 11/1976 Fed. Rep. of Germany ...... 307/290
2628200 1/1977 Fed. Rep. of Germany .
2816577 10/1979 Fed. Rep. of Germany .
57-75024 5/1982 Japan .................................. 307/279

OTHER PUBLICATIONS

Patent Abstracts of Japan, vol. 6, No. 176, 9/10/82 and JP-A-57-93721.
Patent Abstracts of Japan, vol. 4, No. 137, 9/25/80, p. 95 E 27 and JP-A-55-90130.
Patent Abstracts of Japan, vol. 1, No. 114, 9/30/77, p. 4317 E 77 and JP-A-52-46748.
Patent Abstracts of Japan, vol. 3, No. 96, 8/15/79, p. 74 E 130 and JP-A-54-74358.

Primary Examiner—Larry N. Anagnos
Assistant Examiner—D. R. Hudspeth
Attorney, Agent, or Firm—Finnegan, Henderson, Farabow, Garrett & Dunner

[57] ABSTRACT

In the Schmitt trigger circuit, a common input signal is supplied to first and second wave-shaping circuits, which have different threshold voltages and which provide different output wave-shaped signals. These wave-shaped signals are alternately selected by a selection circuit to provide the composite Schmitt trigger output signal. When the logic level of the output signal of the selected wave-shaping circuit is inverted due to a change in the input signal to that selected wave-shaping circuit, the output of the other wave-shaping circuit is selected by the selection circuit to provide the Schmitt trigger output signal.

11 Claims, 31 Drawing Figures

F I G. 12
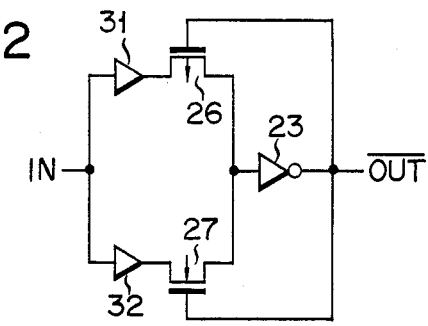
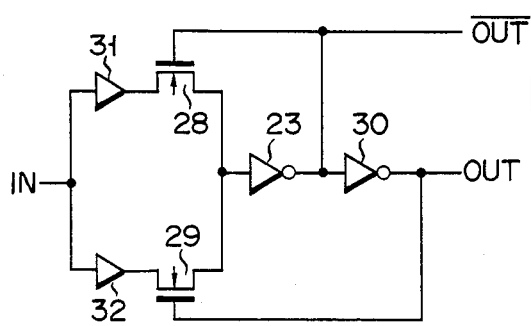
F I G. 13
F I G. 14
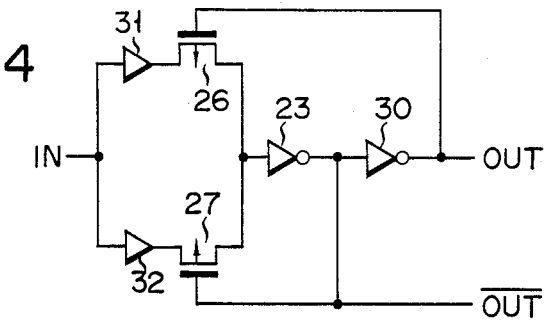
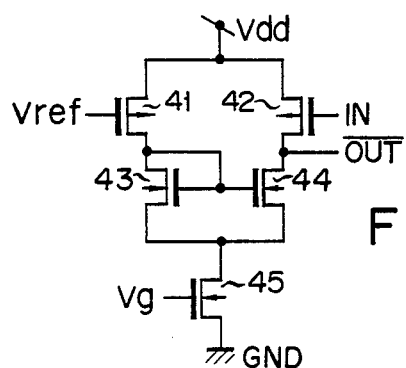
F I G. 15

F I G. 20
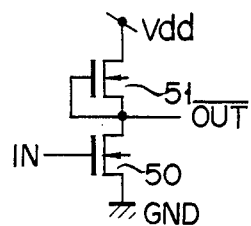
F I G. 21
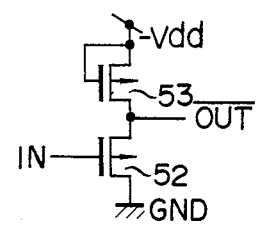
F I G. 22
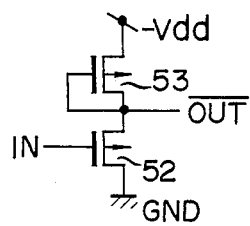
F I G. 23
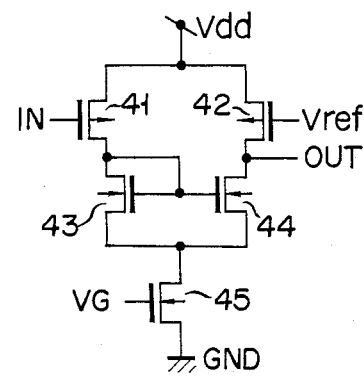
F I G. 24
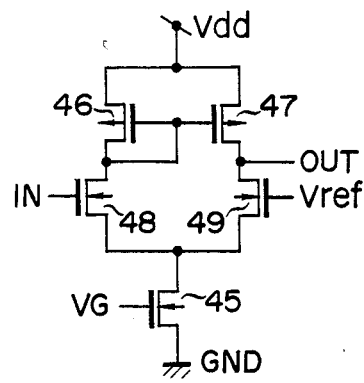

SCHMITT TRIGGER CIRCUIT WITH SELECTION CIRCUIT

BACKGROUND OF THE INVENTION

The present invention relates to a Schmitt trigger circuit having good hysteresis characteristics.

A conventional Schmitt trigger circuit operates on the basis of different threshold values when an input signal level increases and decreases. The circuit has hysteresis characteristics in changes of the output signal level with respect to changes in the input signal level. Thus, the circuit has a wide noise margin and does not have a tendency to operate erratically, due to noise included in the input signal. For this reason, the circuit is used in converting an input signal having slow leading and trailing edges into an output signal having sharp leading and trailing edges, in accordance with a preset threshold voltage.

FIG. 1 is a circuit diagram of the Schmitt trigger circuit disclosed in Japanese patent publication No. 55-90130. An input signal IN is supplied to one input terminal of a NAND gate 2, through an inverter 1. The input signal IN is also supplied to one input terminal of another NAND gate 3, through two inverters 4, 5 connected in series therewith. The NAND gates 2, 3 cross feed their outputs back to the other input terminal thereof, and thereby constitute an SR flip-flop. Therefore, the output from inverter 1 is a set input S to the flip-flop, and the output from inverter 5 is a reset input R to the flip-flop. An output signal OUT appears at the output terminal of NAND gate 2. With reference to FIG. 1, inverters 1 and 4 have different threshold voltages; with inverter 1 having a high threshold voltage and inverter 4 having a low threshold voltage.

FIG. 2 is a circuit diagram of the CMOS inverter serving as the basic unit of the circuit shown in FIG. 1. Referring to FIG. 2, reference numeral 6 denotes a p-channel MOS transistor and 7 denotes an n-channel MOS transistor. The gates of the transistors 6 and 7 are commonly connected and receive an input voltage Vin. The source of the transistor 6 is connected to a power source voltage Vdd, and the drain thereof is connected to the drain of the transistor 7. An output voltage Vout is produced from the common node of the drain of the transistor 6 and the drain of the transistor 7. The source of the transistor 7 is connected to a GND potential.

In FIG. 3, curve A shows the input voltage (Vin) vs. the output voltage (Vout) characteristics of the CMOS inverter shown in FIG. 2. Referring to this characteristic curve A, when the intersection of the curve with a curve wherein Vin=Vout is defined as a threshold voltage Vt, this voltage Vt is given by the following equation:

$$Vt = [\{Vthn/Vdd + \sqrt{\beta p/\beta n}\ (1 - |Vthp|/Vdd)\}/(1 + \sqrt{\beta p/\beta n}\ )] \cdot Vdd \quad (1)$$

where:
- Vthn: threshold voltage of the n-channel MOS transistor
- Vthp: threshold voltage of the p-channel MOS transistor
- $\beta n$: current amplification factor of the n-channel MOS transistor
- $\beta p$: current amplification factor of the p-channel MOS transistor.

If we assume that the relationship wherein $\beta p < \beta n = \infty$ holds true in equation (1) above, equation (2) below can be obtained, as follows:

$$Vt = Vthn \quad (2)$$

A modification of equation (1) yields equation (3), below:

$$Vt = [\{\sqrt{\beta n/\beta p} \cdot \sqrt{Vthn/Vdd} + 1 - |Vthp|/Vdd\}/(1 + \sqrt{\beta n/\beta p}\ )] \cdot Vdd \quad (3)$$

If we assume that the relationship wherein $\beta n < \beta p = \infty$ holds true in equation (3) above, equation (4) below may be obtained, as follows:

$$Vt = Vdd - |Vthp| \quad (4)$$

Accordingly, in the inverter shown in FIG. 2, the threshold voltage Vt can be freely changed in accordance with the ratio of current amplification factors $\beta n$ and $\beta p$ of p and n-channel transistors 6 and 7, respectively. The variable range of the threshold voltage Vt has, as a lower limit, the value Vthn given by equation (2) above; and, as an upper limit, the value Vdd−|Vthp| given by equation (4) above, as may be seen from curve B in FIG. 3.

If the channel width is defined as W and the channel length is defined as L, the current amplification factor $\beta$ of the MOS transistor is proportional to the ratio, W/L. This implies that the current amplification factor $\beta$ of the MOS transistor can be changed and the threshold voltage Vt of the CMOS inverter can be changed by changing the ratio W/L of the channel width W to the channel length L of the MOS transistor.

In the CMOS inverter shown in FIG. 2, the threshold voltage Vt can be changed in accordance with the current amplification factor $\beta$ of the MOS transistor. Utilizing this fact, a threshold voltage VtH of the inverter 1 is set to be high, and a threshold voltage VtL of the inverter 4 is set to be low. With this arrangement, as shown in the timing charts in FIG. 4, when the input signal IN gradually rises in level from the GND level, reaches the power source voltage Vdd, and thereafter returns to the GND level, an output S from the inverter 1, an output R from the inverter 5, and an output signal OUT from the flip-flop change in the manner to be described below. The input signal IN rises from time T1 and reaches the threshold voltage VtL at time T2 of the inverter 4, and an output P from the inverter 4 goes from level "H" to level "L" and the output R from the inverter 5 goes from level "L" to "H". When the input signal IN rises further and reaches the threshold voltage VtH at time T3, the outputs S from the inverter 1 goes from level "H" to level "L". The set terminal S of the flip-flop consisting of the NAND gates 2 and 3 is set at level "L", the reset terminal R is set at level "H", and the output signal OUT goes from level "L" to "H".

After the input signal IN further increases to reach the power source voltage Vdd, it decreases and reaches the threshold voltage VtH of the inverter 1 at time T4. Thus, the output from the inverter 1 goes from level "L" to "H" at time T4. The input signal IN further decreases to reach the threshold voltage VtL of the inverter 4, and the output from the inverter 4 goes from level "L" to "H" and the output R from the inverter 5 goes from level "L" to "H". At this time point, the set terminal S of the flip-flop is at level "H" and the reset terminal R thereof is at level "L", and the output signal OUT thereof goes from level "H" to level "L".

A Schmitt trigger circuit consisting of the SR flip-flop and CMOS inverter shown in FIG. 1 can be made to have the hysteresis characteristics which pertain to a change in the output voltage Vout with respect to a change in the input voltage Vin, by using inverters having different threshold voltages.

However, in the Schmitt trigger circuit shown in FIG. 1, each of the three CMOS inverters requires two MOS transistor elements. Furthermore, each of the two NAND gates constituting a flip-flop circuit requires four MOS transistor elements. Thus, the circuit shown in FIG. 1 requires a total of 14 elements.

However, in the semiconductor industry, and especially in the field of integrated circuits, it is desired that the number of elements be reduced to minimize the chip size, reduce the manufacturing cost and improve the manufacturing yield. Since the Schmitt trigger circuit shown in FIG. 1 requires a large number of elements and increases the chip size, it is strongly desired to decrease the number of elements without impairing the performance of the circuit.

SUMMARY OF THE INVENTION

A primary object of the present invention is to provide a Schmitt trigger circuit which has a simple circuit configuration, to allow a reduction in the number of elements; which is capable of changing the Schmitt pulse width and providing excellent hysteresis characteristics, irrespective of the small number of elements; which is suitable for CMOS integrated circuits; and which can perform a high-speed, low-voltage operation.

Additional objects and advantages of the invention will be set forth in part in the description which follows, and in part will be obvious from the description, or may be learned by practice of the invention. The objects and advantages of the invention may be realized and attained by means of the instrumentalities and combinations particularly pointed out in the appended claims.

To achieve the objects and in accordance with the purpose of the invention, as embodied and broadly described herein, the Schmitt trigger circuit of this invention comprises first and second wave-shaping circuits which have different respective threshold voltages and which receive a common input signal and provide different output wave-shapes in accordance with their respective threshold voltages and changes in said input signal; and a selection circuit which receives outputs from both said first and second wave-shaping circuits and which selects the output of one of said wave-shaping circuits to provide the Schmitt trigger output signal in response to the logic level of the output wave-shape of said selected wave-shaping circuit, and, in response to an inversion in logic level of the output wave-shape of the selected wave-shaping circuit, selects the output of the other of said wave-shaping circuits to provide the Schmitt trigger output signal.

The accompanying drawings, which are incorporated in and constitute a part of this specification, illustrate embodiments of the invention and together with the description, serve to explain the principles of the invention.

BRIEF DESCRIPTION OF THE DRAWINGS

FIGS. 8 to 14 are block diagrams of other embodiments of the present invention;

FIGS. 15 to 22 are circuit diagrams of the inverters used in the circuit of the present invention;

FIGS. 23 to 26 are circuit diagrams of the non-inverters used in the circuit of the present invention;

DETAILED DESCRIPTION OF THE PREFERRED EMBODIMENTS

The principle of the present invention may now be described, with reference to the block diagram shown in FIG. 5. In the Schmitt trigger circuit of the present invention, an input signal IN is supplied to a first wave-shaping circuit 11 and a second wave-shaping circuit 12. The first and second wave-shaping circuits 11 and 12 have different threshold voltages. Outputs from the first and second wave-shaping circuits 11, 12 are supplied as input signals to a selection circuit 13. The selection circuit 13 selects the output of one of the wave-shaping circuits 11, 12 in response to the logic level of the output wave-shape of the selected wave-shaping circuit, and outputs it as the Schmitt trigger output signal. When the logic level of the output of the selected wave-shaping circuit is inverted due to a change in the input signal applied to that wave-shaping circuit, the selection circuit 13 selects the output of the other wave-shaping circuit to provide the Schmitt trigger output signal.

The first and second wave-shaping circuits 11, 12 may comprise inverter or non-inverter circuits. The selection circuit 13 may comprise a transmission gate circuit and an inverter circuit. Accordingly, the total number of elements is smaller than that of the conventional Schmitt trigger circuit shown in FIG. 1.

Figure 5:
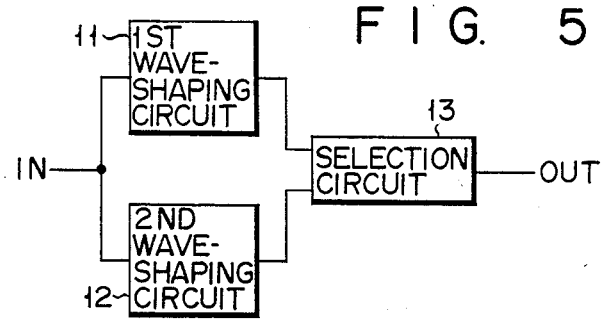
FIG. 5 is a block diagram illustrating the principle of the present invention.
Figure 6:
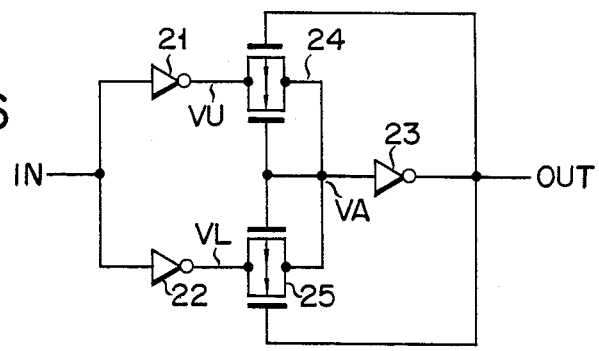
FIG. 6 is a circuit diagram of an embodiment of the present invention.

FIG. 6 is a circuit diagram of a preferred embodiment of the Schmitt trigger circuit shown in FIG. 5. Referring to FIG. 6, reference numerals 21, 22 and 23 denote CMOS inverters each comprising p- and n-channel MOS transistors. Reference numerals 24 and 25 denote transmission gates, each comprising p and n-channel MOS transistors. The input signal IN is commonly supplied to the input terminals of the CMOS inverters 21, 22. An output voltage VU from the inverter 21 is supplied to the transmission gate 24. An output voltage VL from the inverter 22 is supplied to the transmission gate 25. Outputs from the transmission gates 24 and 25 are wired-OR and are supplied to the inverter 23. The gate of the n-channel MOS transistor of the transmission gate 24 is connected to the gate of the p-channel MOS transistor of the transmission gate 25. An output signal OUT from the inverter 23 is connected to the gate of the p-channel MOS transistor of the transmission gate 24 and to the gate of the n-channel MOS transistor of the transmission gate 25.

As described above, the threshold voltage of a CMOS inverter can be changed by altering the current amplification factors $\beta$ of the p and n-channel MOS transistors constituting the inverter. In the embodiment shown in FIG. 6, the inverter 21 has a high threshold voltage VtH and the inverter 22 has a low threshold voltage VtL, in accordance with this principle.

Figure 7:
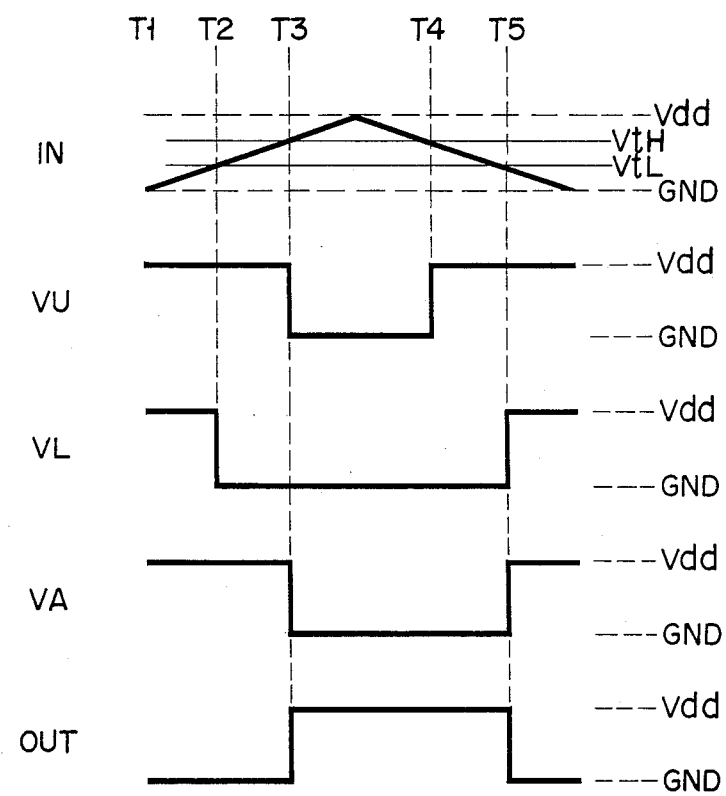
FIG. 7 is a timing chart for use in explaining the mode of operation of the circuit shown in FIG. 6.

Accordingly, the Schmitt trigger circuit shown in FIG. 6 operates according to the timing chart shown in FIG. 7. Here, it is assumed that the input signal IN gradually increases from the GND level, to reach the power source voltage Vdd, and then returns to the GND level. In this case, output SIGNAL VU, VL from inverters 21 and 22, the SIGNAL VA at the wired-OR node of transmission gates 24 and 25, and the output signal OUT change, in accordance with such changes in the input signal IN. At time T1, the input signal IN is at the GND level which is sufficiently low. Thus, the output voltages VU and VL from the inverters 21 and 22 are both at level "H". Also, one of the transmission gates 24 and 25 is turned on in this state. That is, when the wired-OR output from the transmission gates 24 and 25 is at level "H", the transmission gate 24 is ON and the transmission gate 25 is OFF. The output voltage VU from the inverter 21 is at level "H" and the output signal OUT is at level "L".

When the input signal IN increases and reach the threshold voltage VtL of the inverter 22 at time T2, the output voltage VL from the inverter 22 goes from level "H" to level "L". However, the transmission gate 25 remains OFF. Even though the output voltage VL from the inverter 22 changes, the output signal OUT from the inverter 23 is unchanged. When the input signal IN further increases and reaches the threshold voltage VtH of the inverter 21, the output voltage VU from the inverter 21 goes from level "H" to level "L". At this time, since the transmission gate 24 has been ON, the input signal VA to the inverter 23 changes from level "H" to level "L", and the output signal OUT is also inverted to level "H". Transmission gate 24 is turned off and transmission gate 25 is turned on.

After the input signal IN reaches a peak value substantially equal to the power source voltage Vdd, it gradually decreases. When the input signal IN thus reaches the threshold voltage VtH of the inverter 21 at time T4, the output voltage VU from the inverter 21 is inverted from level "L" to level "H". At this time, the transmission gate 24 remains OFF. Even though the output voltage VU from the inverter 21 changes, the output signal from the inverter 23 is unchanged. When the input signal IN further decreases and reaches the threshold voltage VtL of the inverter 22 at time T5, the output voltage VL from the inverter 22 goes from level "L" to level "H". Since the transmission gate 25 is ON, the input signal VA to the inverter 23 goes from logic level "L" to logic level "H", and the output signal OUT goes from level "H" to level "L". Then, transmission gate 24 is turned on and transmission gate 25 is turned off. Thus, the state at time T1 is restored.

The circuit consisting of a transmission gate circuit and a CMOS inverter circuit can operate as a Schmitt trigger circuit which has hysteresis characteristics pertaining to a change in an output signal OUT with respect to a change in an input signal IN, by controlling switching between the transmission gates via CMOS inverters having different threshold voltages.

In the Schmitt trigger circuit shown in FIG. 6, each of the three CMOS inverters consists of two MOS transistors, and each of the two transmission gates consists of two MOS transistors. Thus, the circuit uses a total of 10 elements. Thus, this embodiment requires only 10 elements whereas the conventional Schmitt trigger circuit shown in FIG. 1 requires 14 elements. Thus, the number of elements to be used in the present invention can be reduced to about $\frac{2}{3}$ that of the conventional case. When a number of Schmitt trigger circuits each having such a simple circuit configuration are used for a part of an MOS integrated circuit, the chip size can be reduced to a minimum. Thus, the circuit of the present invention is suitable for higher integration.

Figure 1:
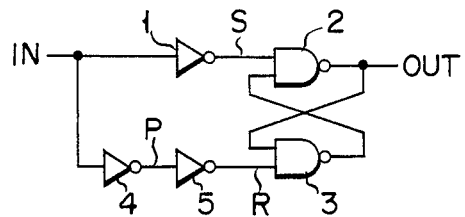
FIG. 1 is a circuit diagram of a conventional Schmitt trigger circuit.
Figure 2:
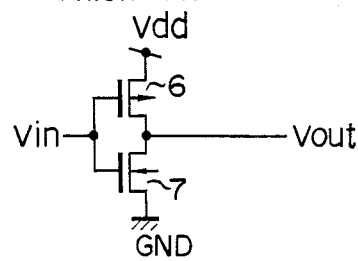
FIG. 2 is a circuit diagram of the CMOS inverter serving as the basic unit of the Schmitt trigger circuit shown in FIG. 1.
Figure 3:
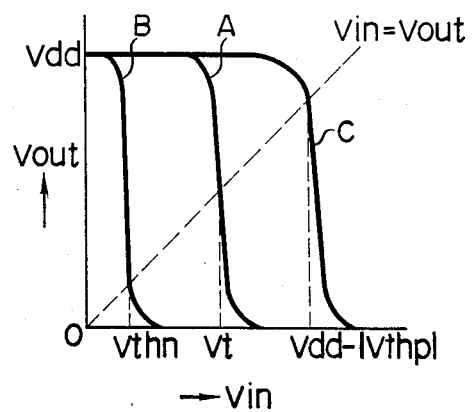
FIG. 3 is a graph showing the input/output characteristics of the CMOS inverter shown in FIG. 2.
Figure 4:
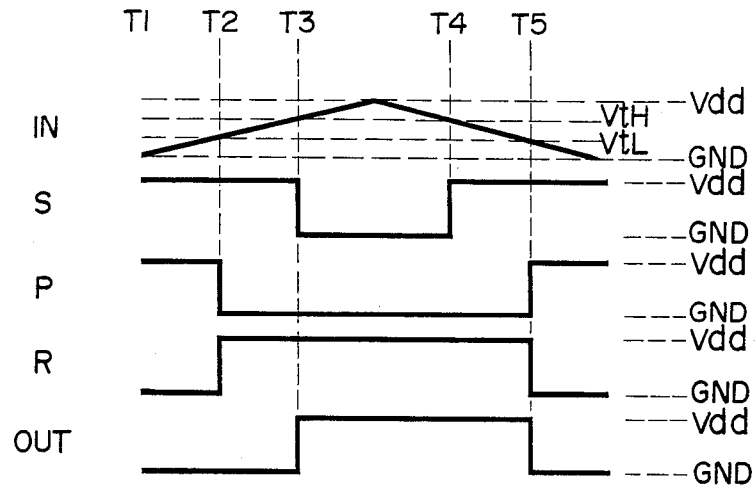
FIG. 4 is a timing chart for use in explaining the mode of operation of the Schmitt trigger circuit shown in FIG. 1.

In the conventional circuit employing a flip-flop such as shown in FIG. 1, at most four output stages are provided between the input and the output, whereas in the present invention at most three stages are provided therebetween. The circuit in FIG. 6 is suitable for high speed operation. In the conventional circuit shown in FIG. 1, the minimum operating voltage is determined by the NAND gates. By way of contrast, in the circuit shown in FIG. 6, the minimum operating voltage is determined by the inverters and can be low, since each inverter includes fewer elements serially connected between the power supply VDD and the ground potential GND than another logic circuit used in the conventional circuit.

As in the case of the conventional Schmitt trigger circuit of FIG. 1, the Schmitt trigger circuit of FIG. 6 allows for the free setting of the threshold voltages of MOS transistors constituting each of the CMOS inverters used in receiving the input signal IN, by changing the parameters (W/L) of the respective transistors and thereby controlling the proper ratio of their current amplification factors $\beta n$, $\beta p$. Thus, the Schmitt pulse width can be freely changed in accordance with the threshold voltages of the CMOS inverters 21 and 22, thereby providing excellent hysteresis characteristics.

In the Schmitt trigger circuit of FIG. 6, CMOS inverters 21 and 22 correspond to the first and second wave-shaping circuits (11 and 12) of FIG. 5, and transmission gates 24 and 25 and the inverter 23 correspond to the selection circuit 13 shown in FIG. 5.

FIGS. 8 to 14 show further preferred embodiments of Schmitt trigger circuits constructed in accordance with the present invention.

Figure 8:
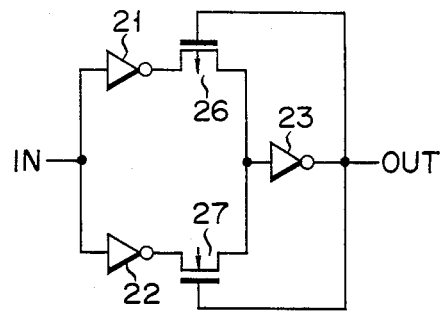

By way of contrast to the circuit of FIG. 6, transmission gates 26 and 27 of the circuit shown in FIG. 8 respectively comprise a p-channel MOS transistor and an n-channel MOS transistor. Therefore, the elements of the circuit are reduced to eight, thereby further decreasing the number of elements on the chip constituting the Schmitt trigger circuit.

Figure 9:
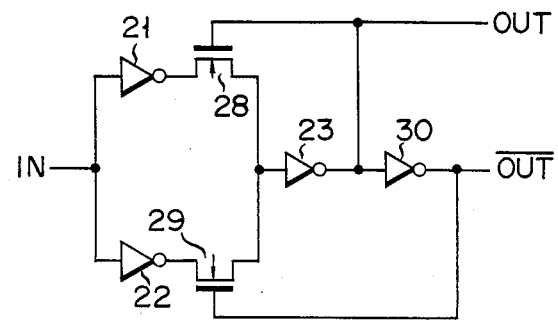

In the embodiment shown in FIG. 9, transmission gates 28 and 29 collectively comprise an n-channel MOS transistor. A CMOS inverter 30 is connected to the output stage of the inverter 23. An output signal OUT from the inverter 23 is supplied to the gate of the transmission gate 28, and an output signal $\overline{OUT}$ from the inverter 23 is supplied to the gate of the transmission gate 29.

Figure 10:
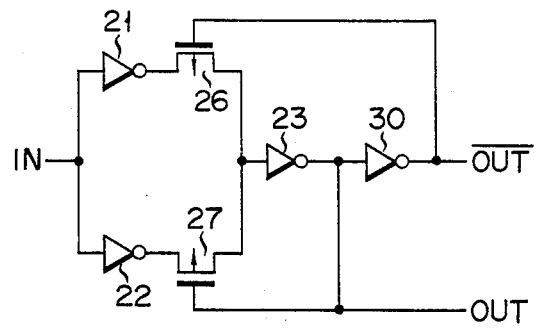

In the embodiment shown in FIG. 10, transmission gates 26 and 27 collectively comprise a p-channel MOS transistor. An output signal OUT from the inverter 23 is supplied to the gate of the transmission gate 27, and an output signal $\overline{\text{OUT}}$ from the inverter 30 is supplied to the gate of the transmission gate 26.

Figure 11:
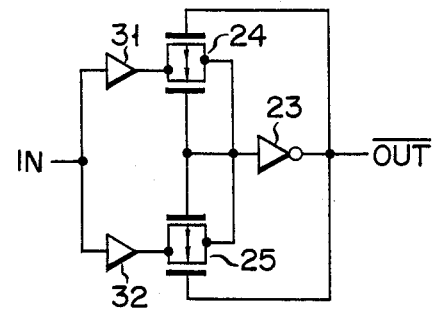

In the embodiment shown in FIG. 11, non-inverters 31 and 32 are used in place of the inverters 21, 22 of the embodiment shown in FIG. 6. In this case, the non-inverters 31, 32 have different threshold voltages.

In the embodiment shown in FIG. 12, non-inverters 31 and 32 are used in place of the inverters 21, 22 of the embodiment shown in FIG. 8.

In the embodiment shown in FIG. 13, non-inverters 31 and 32 are used in place of the inverters 21, 22 of the embodiment shown in FIG. 9.

In the embodiment shown in FIG. 14, non-inverters 31 and 32 are used in place of the inverters 21, 22 of the embodiment shown in FIG. 10.

It is to be understood that the Schmitt trigger circuits of the embodiments shown in FIGS. 8 to 14 operate in a manner similar to that of the Schmitt trigger circuit shown in FIG. 6.

FIGS. 15 to 22 show different examples of the inverters used in varying the threshold voltages of the Schmitt trigger circuits shown in FIGS. 6 to 10, respectively.

In the inverter of FIG. 15, a current mirror circuit consisting of a pair of n-channel MOS transistors 43, 44 and an n-channel MOS transistor 45 for constant current control, are inserted as loads of a differential circuit consisting of a pair of p-channel transistors 41, 42. Reference symbol Vdd denotes a power source voltage; GND, a ground level; Vref, a reference voltage for changing the threshold voltage; IN, an input signal; and Vg, a constant current control voltage. Therefore, a threshold voltage Vt can be freely changed by changing the constant current control voltage Vref.

Figure 16:
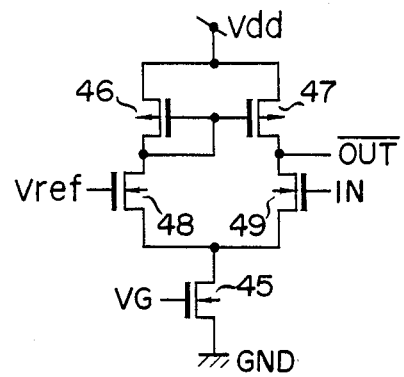

The inverter shown in FIG. 16 differs from that of FIG. 15, in that the differential circuit consists of n-channel transistors 48, 49, and the current mirror circuit consists of p-channel MOS transistors 46, 47.

Figure 17:
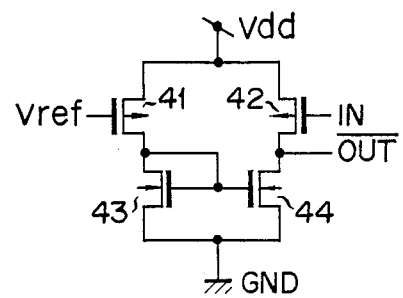
Figure 18:
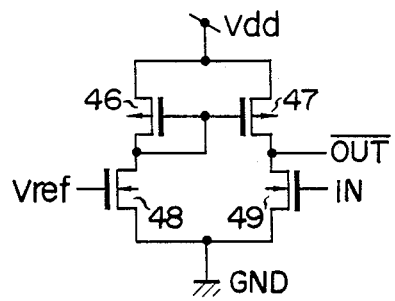

The inverter shown in FIG. 17 is the same as that shown in FIG. 15, except that the constant current control transistor has been omitted. The inverter shown in FIG. 18 is the same as that shown in FIG. 16 except that the constant current control transistor is omitted.

When the inverters shown in FIGS. 15 to 18 are used, wherein the threshold voltages can be freely set in accordance with an externally supplied reference voltage Vref, the hysteresis characteristics of the Schmitt trigger circuit can be freely changed, in accordance with the reference voltage Vref.

Figure 19:
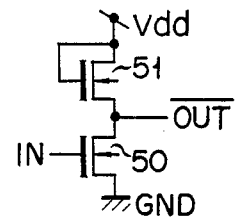
Figure 25:
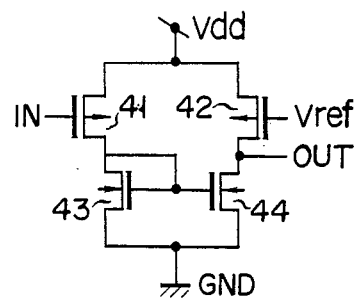
Figure 26:
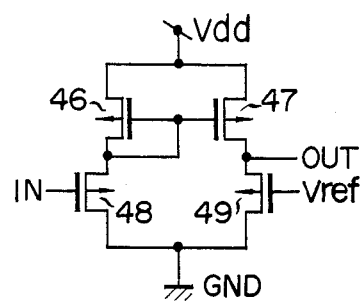

The inverters shown in FIGS. 19 and 20 use two n-channel MOS transistors 50, 51. Each of these inverters sets the threshold voltage of the load transistor 50 and drive transistor 51 which receives the input signal IN.

The inverter shown in FIGS. 21 and 22 uses p-channel MOS transistors 52, 53 in place of the n-channel MOS transistors 50, 51 shown in FIGS. 19 and 20. Each of these inverters sets the threshold voltage of the load transistor 52 and drive transistor 53 which receives the input signal IN.

FIGS. 23 to 26 show various examples of non-inverters which can be used in varying the threshold voltages of the Schmitt trigger circuits shown in FIGS. 11 to 14. In the non-inverters shown in FIGS. 23 to 26, the location of the reference voltages Vref for varying the threshold voltages and the input signal IN are reversed from that shown in the inverters in FIGS. 15 to 18, respectively.

Figure 27:
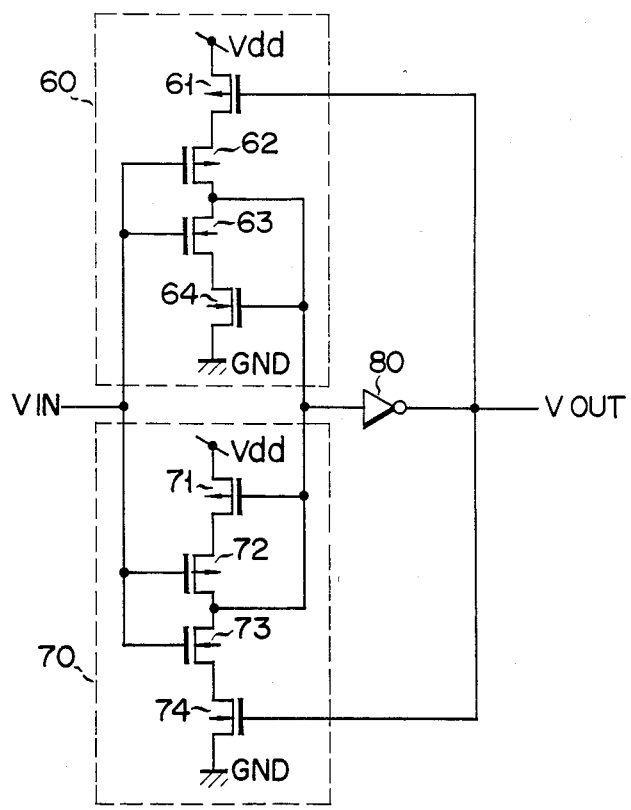
FIG. 27 is a circuit diagram of still another embodiment of the present invention.
Figure 28:
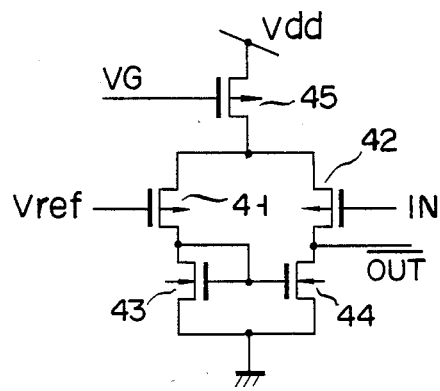
FIGS. 28 to 31 show the inverters and non-inverters whose threshold voltages can be controlled by an external circuit.
Figure 29:
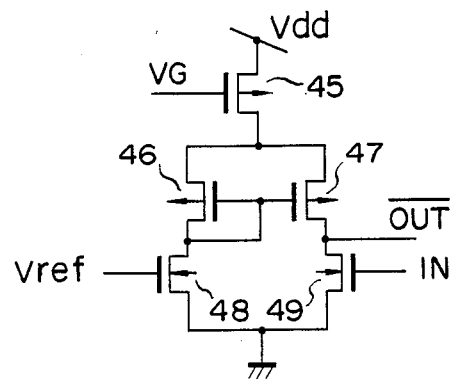
Figure 30:
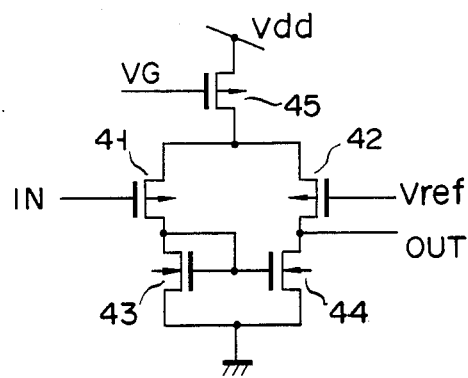
Figure 31:
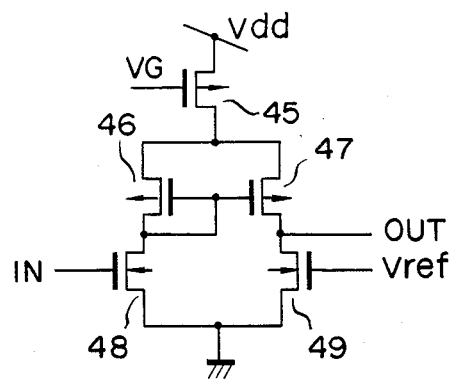

FIG. 27 shows still another embodiment of a Schmitt trigger circuit constructed according to the present invention. The circuit shown in FIG. 27 has a first circuit 60 and a second circuit 70. In the first circuit 60, a p-channel MOS transistor 61 to provide output control, a p-channel MOS transistor 62 and an n-channel MOS transistor 63 for an inverter, and an n-channel MOS transistor 64 to provide output control are inserted in series between a power source VDD and ground GND. The gates of the transistors 62 and 63 of the inverter are commonly connected as an input terminal of the circuit. The drains of the transistors 62 and 63 for the inverter are commonly connected, and its common node is connected to the gate of the transistor 64 for output control and to constitute an output terminal. Similarly, the second circuit 70 consists of p-channel MOS transistors 71 and 72 and n-channel transistors 73 and 74. The common node of the drains of transistors 72 and 73 is connected to the gate of transistor 71, for output control and to constitute an output terminal of the circuit. The first and second circuits 60, 70 have different threshold voltages. The input signal IN is supplied to the input terminals of circuits 60 and 70, and the output terminals of circuits 60 and 70 are WIRED-OR connected to the input terminal of an inverter 80. The output terminal of the inverter 80 is connected the output control of the transistor 61 of the first circuit 60 and the output control of the transistor 74 of the second circuit 70.

In the circuit having the configuration described above, when the input signal IN is at logic level "L", transistor 62 of the first circuit 60 is turned on, transistor 63 thereof is turned off, transistor 72 of the second circuit 70 is turned on, and transistor 73 thereof is turned off. Thus, the input to the inverter 80 is at logic level "H", and the output therefrom is at logic level "L". Both of the transistors 61, 64 of the first circuit 60 are turned on, and both the transistors 71, 74 of the second circuit 70 are turned off. Assuming that the level of the input signal IN increases so that it is higher than the threshold voltage of the second circuit 70 and is lower than the threshold voltage of the first circuit 60, the first circuit 60 will remain unchanged. In the second circuit 70, however, transistor 72 is turned off and transistor 73 is turned on. Nontheless, the input to and output from the inverter 80 remain unchanged since the input and output of inverter 80 are at the "H" level, respectively, and "L" level and transistors 71 and 74 are both off.

When the input signal IN exceeds the threshold voltage of the first circuit 60, the transistor 62 of the first circuit 60 is turned off, and the transistor 63 thereof is turned on. The input to the inverter 80 is at logic level "L", and the output therefrom is at logic level "H". Therefore, the transistors 71, 73 and 74 of the second circuit 70 are turned on, while the transistors 61 and 64 of the first circuit 60 are turned off.

When the input signal IN then has a level which is lower than the threshold voltage of the circuit 60 and is higher than that of the circuit 70, the second circuit 70 is unchanged. In the first circuit 60, the transistor 63 is turned off, and the transistor 62 is turned on. The input to and output from the inverter 80 remain unchanged since the input and output of inverter 80 are at the "H"

level and "L" level, respectively, and transistor 71 and 74 are both off. Subsequently, when the input signal IN decreases and has a level lower than the threshold voltage of the second circuit 70, the transistor 73 of the second circuit 70 is turned off, and the transistor 72 thereof is turned on. The input to the inverter 80 is at logic level "H", and the output signal OUT therefrom is at logic level "L". Thus, the transistors 61, 62, 64 of the first circuit 60 are all turned on and the transistors 72, 73, 74 of the second circuit 70 are turned off.

In this manner, the circuit shown in FIG. 27 operates as a Schmitt trigger circuit which has hysteresis characteristics pertaining to a change in an output signal OUT with respect to a change in an input signal IN. When the threshold voltages of the first and second circuits 60, 70 are variably set at predetermined values, the Schmitt pulse width can be freely set and the number of elements can be reduced.

The inverters shown in FIGS. 15 and 16 and the non-inverters shown in FIGS. 23 and 24, whose threshold voltage may be varied may be modified as shown in FIGS. 28 to 31 more specifically, a transistor 45 for curent control is connected to power supply VDD, not to GND. In this case, transistor 45 is p-channel type.

What is claimed is:

1. A Schmitt trigger circuit comprising:
   first and second wave-shaping circuits which have different respective threshold voltages and which receive a common input signal and provide different output wave-shapes in accordance with their respective threshold voltages and changes in said input signal; and
   a selection circuit which receives outputs from both said first and second wave-shaping circuits and which selects the output of one of said wave-shaping circuits, to provide the Schmitt trigger output signal, in response to the logic level of the output wave-shape of said selected wave-shaping circuit, and, in response to an inversion in logic level of the output wave-shape of the selected wave-shaping circuit, selects the output of the other of said wave-shaping circuits to provide the Schmitt trigger output signal.

2. A Schmitt trigger circuit according to claim 1, wherein said first and second wave-shaping circuits comprise inverters.

3. A Schmitt trigger circuit according to claim 1, wherein said first and second wave-shaping circuits comprise non-inverters.

4. A Schmitt trigger circuit according to claim 1, further comprising a variable reference voltage as the threshold voltages of said first and second wave-shaping circuits thereby to give the desired hysteresis characteristics.

5. A Schmitt trigger circuit according to claim 1, wherein said first and second wave-shaping circuits include transistors, and the threshold voltages of said first and second wave-shaping circuits are controlled in accordance with the current amplification factors of said transistors.

6. A Schmitt trigger circuit according to claim 1, wherein said first and second wave-shaping circuits include MOS transistors, and the current amplification factors of said MOS transistors are controlled in accordance with the ratios of the channel lengths to the channel widths thereof, respectively.

7. A Schmitt trigger circuit according to claim 1, wherein said first and second wave-shaping circuits both comprise MOS transistors.

8. A Schmitt trigger circuit according to claim 1 wherein said selection circuit includes two transfer gates, each connected respectively to the output of one of said wave-shaping circuits, and an inverter connected to the output of said two transfer gates to provide at its output the Schmitt trigger output signal, said inverter output being connected back to both transfer gates to provide the selection signal.

9. A Schmitt trigger circuit comprising:
   first and second wave-shaping circuits which have different respective threshold voltages and which receive a common input signal and provide different output wave shapes in accordance with their respective threshold voltages and changes in said input signal; and
   a selection circuit connected to said first and second wave-shaping circuits and which includes two switches for selectively switching between the outputs of said first and second wave-shaping circuits and an inverter having its input terminal coupled to receive the selected output, the Schmitt trigger output signal being derived from the output of said inverter, and the output of said inverter being connected to at least one of said two switches to function as a selection signal.

10. A Schmitt trigger circuit according to claim 9, wherein the output of said inverter is connected to both of said switches.

11. A Schmitt trigger circuit according to claim 9, wherein said two switches of said selection circuit are transfer gates.

* * * * *